United States Patent [19]
Yamazaki

[11] Patent Number: 5,362,547
[45] Date of Patent: Nov. 8, 1994

[54] FILM CARRIER

[75] Inventor: Hideo Yamazaki, Sagamihara, Japan

[73] Assignee: Minnesota Mining and Manufacturing Company, St. Paul, Minn.

[21] Appl. No.: 745,918

[22] Filed: Aug. 16, 1991

[30] Foreign Application Priority Data

Aug. 20, 1990 [JP] Japan .................. 2-86991[U]

[51] Int. Cl.⁵ .............................. B32B 3/28
[52] U.S. Cl. .................. 428/167; 428/156; 428/172; 428/209; 428/901
[58] Field of Search ........... 428/167, 156, 172, 188, 428/209, 901, 192; 174/250, 295

[56] References Cited

U.S. PATENT DOCUMENTS

| 4,663,204 | 5/1987 | Langham | 428/167 |
| 4,835,034 | 5/1989 | Cruz | 428/167 |

FOREIGN PATENT DOCUMENTS 1-251079  6/1989  Japan .

Primary Examiner—Donald J. Loney
Attorney, Agent, or Firm—Gary L. Griswold; Walter N. Kirn; John C. Barnes

[57] ABSTRACT

A film carrier having a multiplicity of leads bonded on one surface, is provided with a thickness-reduced portion at the area where the tape is to be bent to remove stress to the leads.

10 Claims, 3 Drawing Sheets

FILM CARRIER

FIELD OF THE INVENTION

The present invention relates to a film carrier on which an integrated circuit device or the like is mounted and wherein the film carrier is bent when a panel type display such as a liquid crystal display panel is manufactured.

BACKGROUND OF THE INVENTION

A conventional film carrier (see Japanese Patent Laid-Open No. 1-251079) has been arranged as shown in FIG. 6 in such a manner that reinforcing leads 35 and 40 are provided on a film carrier 30 and two slits 50 are formed at a bent portion.

The conventional film carrier has no organic insulating film for supporting the leads, which serve as conductor patterns, in the above-described slit portion. Therefore, the conductor pattern may be easily deformed, causing an electric short circuit to occur at the time of the bending work or other working processes. Furthermore, the conductor pattern in the slit appears outside when viewed from the organic insulating film side. Therefore, the lead may encounter an electric short circuit with the adjacent leads and the peripheral circuits.

The present invention provides a film carrier capable of overcoming the above-described problems and assuredly preventing the electric short circuit which takes place in a conductor pattern formed on the film carrier.

SUMMARY OF THE INVENTION

The above-described problems are overcome by the present invention in a film carrier made of an organic insulating film arranged to have a thickness-reduced portion extending transversely to the lengthwise direction of a multiplicity of leads secured to the film in such a manner that the multiplicity of leads are separated from and run parallel to one another, the thickness-reduced portion being formed for the purpose of aiding to bend the film.

It is preferable that the thickness-reduced portion be in the form of a groove on the side of the film opposite the leads.

The film carrier constituted as described above can be easily bent together with the leads due to the provision of the thickness-reduced portion extending perpendicularly to the lengthwise direction of a multiplicity of the leads.

Furthermore, the leads disposed on the surface of the film and the mounted body are physically disposed outside.

DETAILED DESCRIPTION OF THE PRESENTLY PREFERRED EMBODIMENTS

Two embodiments of a film carrier according to the present invention will be described with reference to the drawings.

Figure 1:
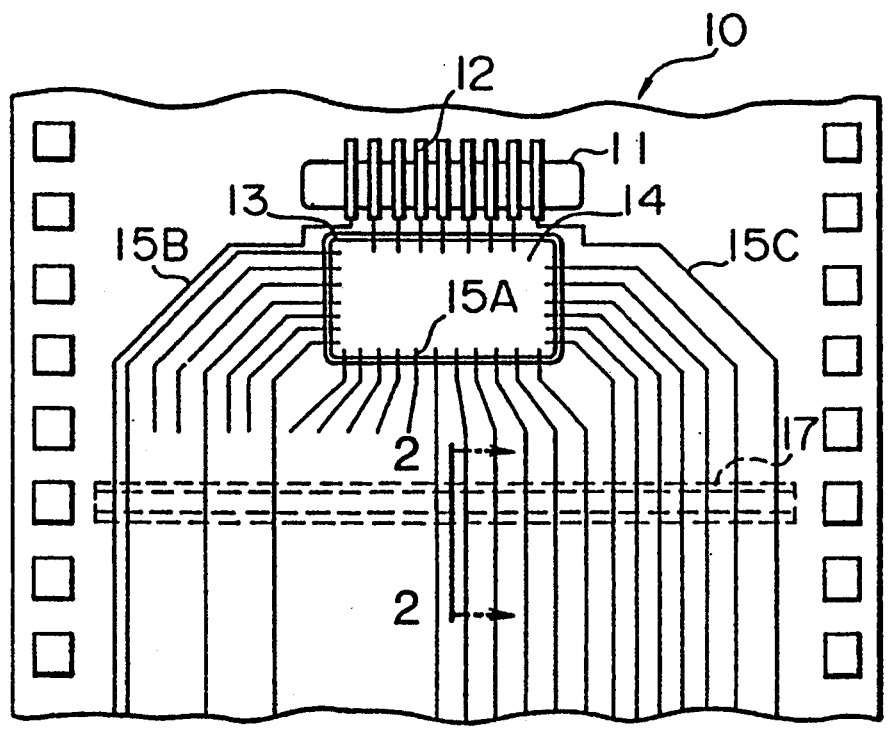
FIG. 1 is a plan view which illustrates an embodiment of the present invention.

FIG. 1 illustrates a portion of a first embodiment of a film carrier 10 made of an organic insulating film.

A semiconductor device 14 disposed in a device opening 13 is mounted on the film carrier 10. A multiplicity of leads 15A, 15B and 15C each of which is made of copper are, then bonded to the leads of the device, which leads extend from the semiconductor device 14 in the lengthwise direction of the film carrier.

The film carrier 10 is bent (see FIG. 3) when it is used in such a manner that a portion 18 thereof is bent substantially semicircularly. As a result, a compact semiconductor device, such as a panel type display including a crystal display panel or the like, can be manufactured.

The film carrier according to this embodiment has a groove 17 (see FIG. 2) on the reverse side thereof in a direction transverse, and as indicated in the drawing perpendicular, to the lengthwise direction of the above-described multiplicity of leads 15A. Although a single groove is provided according to this embodiment, a plurality of grooves may be formed.

Figure 2:
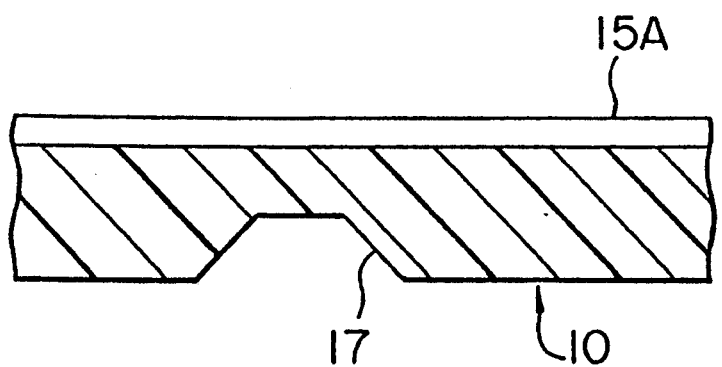
FIG. 2 is a cross sectional view taken along line 2—2 of FIG. 1.
Figure 5:
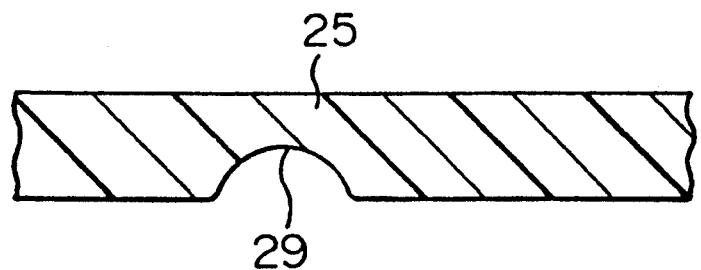
FIG. 5 is a vertical cross sectional view which illustrates another embodiment of the present invention.
Figure 6:
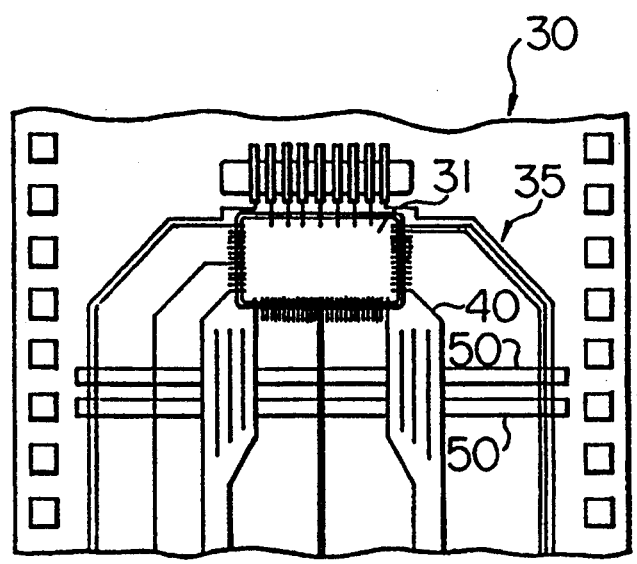
FIG. 6 is a plan view which illustrates a conventional film carrier.

FIG. 2 is a cross sectional view of the film 10 shown in FIG. 1 taken along line 2—2 of FIG. 1, where a plurality of the leads, 15A, 15B, 15C are disposed on the film 10 and the groove 17 formed in the film 10 has a trapezoidal cross sectional shape. FIG. 5 shows the groove 29 according to another embodiment of the present invention, the groove having a substantially semicircular cross sectional shape. According to the above-described examples, the structure is arranged in such a manner that the concentration of residual stress to a portion after the bending can be prevented.

Figure 3:
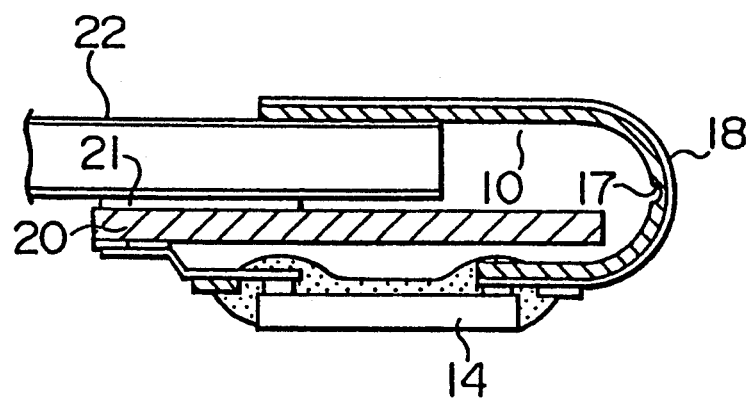
FIG. 3 is a vertical cross section of the embodiment shown in FIG. 1.

A case in which the film carrier according to the present invention is bent in the form of a substantially semicircular shape will be described with reference to an embodiment shown in FIG. 3.

The film carrier 10 is bent at the bending portion 18 thereof. The semiconductor device 14 is mounted on the film carrier 10 and a printed circuit substrate 20 and a liquid crystal display panel 22 are, by an adhesive 21, disposed on the inner surface of the thus bent film carrier. Since the bent film carrier 10 has no slit which has been provided for the conventional type film carrier, an extremely strong durability is exhibited.

The angle and the bending direction may be properly determined in accordance with the state of mounting, that is, they may be properly determined in consideration of the direction of the extension of the leads along the surface of the film carrier.

Figure 4:
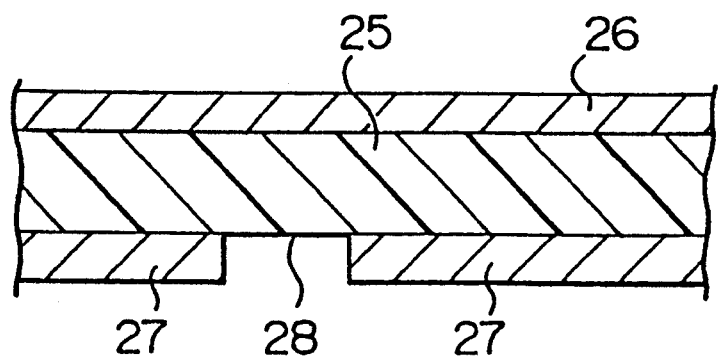
FIG. 4 is a vertical cross sectional view which illustrates the method of manufacturing another embodiment of the present invention.

Then, a method of manufacturing the groove according to another embodiment (see FIG. 5) will be described with reference to FIG. 4.

In a first process, photosensitive films 26 and 27, which are stable to chemicals which are used for dissolving the organic insulating film, are respectively applied to the upper and the lower surfaces of the film carrier 25. In a second process, a portion of the photosensitive film 27 is removed by a photolithography. As a third process, the organic insulating film in the portion 28, from which the photosensitive film has been removed in the second process, is dissolved by chemical etching so as to reduce the thickness of the subject portion. Reference numeral 29 shown in FIG. 5 represents the cross sectional shape of the thickness-reduced portion. In a fourth process, the photosensitive films 26 and 27 applied in the first process are removed.

As another embodiment, the groove in the film carrier according to the present invention may be formed by laser beams.

Since the film carrier, according to the present invention, is constituted as described above, it can be easily manufactured. Furthermore, the electric short circuit which takes place in a conductor pattern formed on the film carrier according to the present invention can be assuredly prevented, that is, the electric short circuit which takes place between the leads and between the peripheral conductor pattern and the circuit can be assuredly prevented.

I claim:

1. A film carrier for supporting an integrated circuit device and comprising an organic electrically insulating film arranged to have a thickness-reduced portion extending perpendicularly to the lengthwise direction of a multiplicity of copper leads secured to said film in such a manner that said multiplicity of leads are separated from and run parallel to one another, said thickness-reduced portion being formed for the purpose of aiding to bend said film.

2. A film carrier according to claim 1 wherein said thickness-reduced portion is a groove which is trapezoidal in cross-section.

3. A film carrier according to claim 1, wherein said thickness-reduced portion is in the form of a groove on the side of said film opposite the side to which said leads are secured.

4. A film carrier according to claim 3 wherein said groove is semicircular in cross-section.

5. A film carrier for use in connecting electronic devices comprising a sheet of electrically insulating film having opposite surfaces and having a multiplicity of electrical leads adhered to one surface of the film and separated from and extending generally parallel to each other along said surface, said sheet having a thickness-reduced portion formed in the surface opposite said one surface supporting said leads and extending transverse to said leads to aid in bending the sheet and the leads.

6. A film carrier according to claim 5 wherein said thickness-reduced portion is a groove formed in the surface of the sheet and having a depth to leave film supporting the leads on said one surface.

7. A film carrier according to claim 6 wherein said groove is semicircular in cross-section.

8. A film carrier according to claim 6 wherein said groove is trapezoidal in cross-section.

9. A film carrier for use in connecting electronic devices comprising a sheet of electrically insulating film having opposite surfaces and having a multiplicity of electrical leads adhered to one surface of the film and separated from and extending generally parallel to each other along said surface, said sheet having a thickness-reduced portion formed in the surface opposite said one surface supporting said leads and extending transverse to said leads to aid in bending the sheet and the leads, wherein the thickness-reduced portion is perpendicular to the path of the leads.

10. A film carrier according to claim 9 wherein an integrated circuit device is mounted on the film and bonded to said leads.

* * * * *